United States Patent
Chan et al.

(10) Patent No.: US 8,339,893 B2
(45) Date of Patent: Dec. 25, 2012

(54) DUAL BETA RATIO SRAM

(75) Inventors: Yuen H. Chan, Poughkeepsie, NY (US); Louis C. Hsu, Fishkill, NY (US); Xu Ouyang, Hopewell Junction, NY (US); Robert C. Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 480 days.

(21) Appl. No.: 12/566,862

(22) Filed: Sep. 25, 2009

(65) Prior Publication Data

US 2011/0075504 A1 Mar. 31, 2011

(51) Int. Cl.
*G11C 8/00* (2006.01)

(52) U.S. Cl. .................... 365/230.05; 365/154; 365/188; 365/189.15; 365/189.16; 365/189.14; 365/189.011; 365/189.05; 365/190; 365/202; 365/203; 365/206; 365/230.03

(58) Field of Classification Search .................. 365/154, 365/188, 189.15, 189.16, 189.14, 189.011, 365/189.05, 190, 202, 203, 206, 230.03, 365/230.05
See application file for complete search history.

(56) References Cited

U.S. PATENT DOCUMENTS

| | | | |
|---|---|---|---|
| 5,973,985 A | 10/1999 | Ferrant | |
| 6,005,795 A | 12/1999 | Hawkins et al. | |
| 6,005,796 A | 12/1999 | Sywyk et al. | |
| 6,181,595 B1 | 1/2001 | Hawkins et al. | |
| 6,262,912 B1 | 7/2001 | Sywyk et al. | |
| 6,731,566 B1 | 5/2004 | Sywyk et al. | |
| 8,159,852 B2 * | 4/2012 | Kouchi et al. | 365/51 |
| 2004/0052147 A1 | 3/2004 | McLaury | |
| 2008/0117666 A1 * | 5/2008 | Russell et al. | 365/154 |
| 2008/0273382 A1 * | 11/2008 | Wang | 365/181 |

* cited by examiner

*Primary Examiner* — Fernando Hidalgo
(74) *Attorney, Agent, or Firm* — Cantor Colburn LLP; William A. Kinnaman, Jr.

(57) ABSTRACT

A static random access memory (SRAM) cell includes a first read port, the first read port having a first beta ratio; and a write port, the write port having a second beta ratio that is substantially lower than the first beta ratio. A static random access memory (SRAM) array includes a plurality of SRAM cells, an SRAM cell including a first read port, the first read port having a first beta ratio; and a write port, the write port having a second beta ratio that is substantially lower than the first beta ratio.

4 Claims, 4 Drawing Sheets

DUAL BETA RATIO SRAM

FIELD

This disclosure relates generally to the field of static random access memory (SRAM), and more particularly to a dual beta ratio SRAM.

DESCRIPTION OF RELATED ART

A static random access memory (SRAM) array comprises a plurality of cells, each cell comprising a pair of cross-coupled metal oxide semiconductor field effect transistor (MOSFET) inverters, each inverter coupled to one or more MOSFET passgates. An individual MOSFET inverter or passgate comprises a source, a drain, and a gate terminal. The pair of cross-coupled inverters has two possible states, enabling the cell to store a bit of data. A plurality of word lines connect the SRAM cells; each word line connects to the passgates of a plurality of cells. Each cell passgate is also connected to one or more respective bit lines. A cell is addressed by the cell's particular word line and bit lines. During a read or write operation, the word line and bit lines corresponding to the cells to be read or written are driven. However, only a subset of all the cells on a driven word line may be of interest for the read or write operation being performed. Cells located on a driven word line whose bit lines are not driven are referred to as half-selected cells. A problem in SRAM design is ensuring that half-selected cells do not switch state during half-selection. A cell disturb, which may result from an incomplete pre-charge or a design imbalance, may cause a cell to switch states during half selection.

Data is written into a cell by driving one of the cell bit lines high, pulling the another of the cell bit line low, and subsequently, driving the cell word line high for a short period of time. With the word line high, the state of the bit lines is transferred to the cross-coupled inverters, and when the word line returns to low, that state is stored in the inverters. Reading data stored in the cell is essentially the reverse of a write. First, the bit lines are pre-charged to a bit line pre-charge voltage level ($V_{pre}$), typically $V_{dd}$. After the bit lines are pre-charged, the bit lines are floated at the pre-charged level, and then the word line is driven high. Depending on the state of the cross-coupled inverters, one of the bit lines is pulled low and the other bit line remains high. The data stored in the cell, as represented by the complementary state of the cross-coupled inverters, is therefore transferred to the bit lines as a voltage difference, allowing the cell data to be read. The amount of time required for the bit line to be pulled low determines the cell read time.

The ratio of the conductance of the cross-coupled MOSFET inverters to the conductance of the MOSFET passgates of a SRAM cell is a basic metric used to measure the stability of the cell, i.e., the ability of the SRAM cell to retain its data state. This ratio is referred as the beta ($\beta$) ratio of the SRAM cell. The larger the beta ratio, the more stable the cell. However, the static noise margin of the cell also increases with the beta ratio. The conductance of a transistor is approximately proportional to the effective carrier mobility $\mu_{eff}$, and to the ratio of the device width to the channel length (W/L). The beta ratio of an SRAM cell can be approximated by the ratio of $\mu_{eff}$ (W/L) of the pull-down nMOS transistor to $\mu_{eff}$ (W/L) of the passgate nMOS transistor.

Primary concerns of SRAM cell design are cell size, cell performance, and cell stability. Cell size may be a function of the particular geometry or minimum feature size available for the technology of which the cell is made. Performance and stability are also affected by cell size. To minimize read time, the resistance of both the passgates and the cross-coupled inverters should be minimized. Typically, the cross-coupled inverters are minimum sized devices, so read performance is gained by reducing the resistance of the passgates. However, reducing the passgate resistance increases transconductance, reducing the beta ratio and cell stability, e.g., by increasing the half select voltage drop across the inverters. Further, at some point the beta ratio may be low enough that even minor noise may cause a half-selected cell to switch state, inadvertently changing the data stored in the cell. However, a more stable cell is harder to switch in a write operation, thus increasing cell write time. Higher stability may also increase cell read time.

SUMMARY

In one aspect, an exemplary embodiment of a static random access memory (SRAM) cell includes a first read port, the first read port having a first beta ratio; and a write port, the write port having a second beta ratio that is substantially lower than the first beta ratio.

In one aspect, a static random access memory (SRAM) array includes a plurality of SRAM cells, an SRAM cell including a first read port, the first read port having a first beta ratio; and a write port, the write port having a second beta ratio that is substantially lower than the first beta ratio.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for a dual beta ratio SRAM array are provided, with exemplary embodiments being discussed below in detail.

A dual beta ratio SRAM cell may have either one or two read ports and one write port. The read port beta ratio is substantially higher than the write port beta ratio. Therefore, during read access, data loss due to disturbance is avoided, and data may be written into the SRAM array with at high speeds. The dual beta ratio multi-port SRAM may have an 8-transistor layout. The read port beta ratio and the write port beta ratio may be selected to allow the cells in the SRAM array to be read without disturbing half-selected cells. The beta ratios for the read and write ports may be adjusted in any appropriate manner, including but not limited to adjustment of passgate size, or choice of passgate material, oxide thickness, or channel doping.

Figure 1:
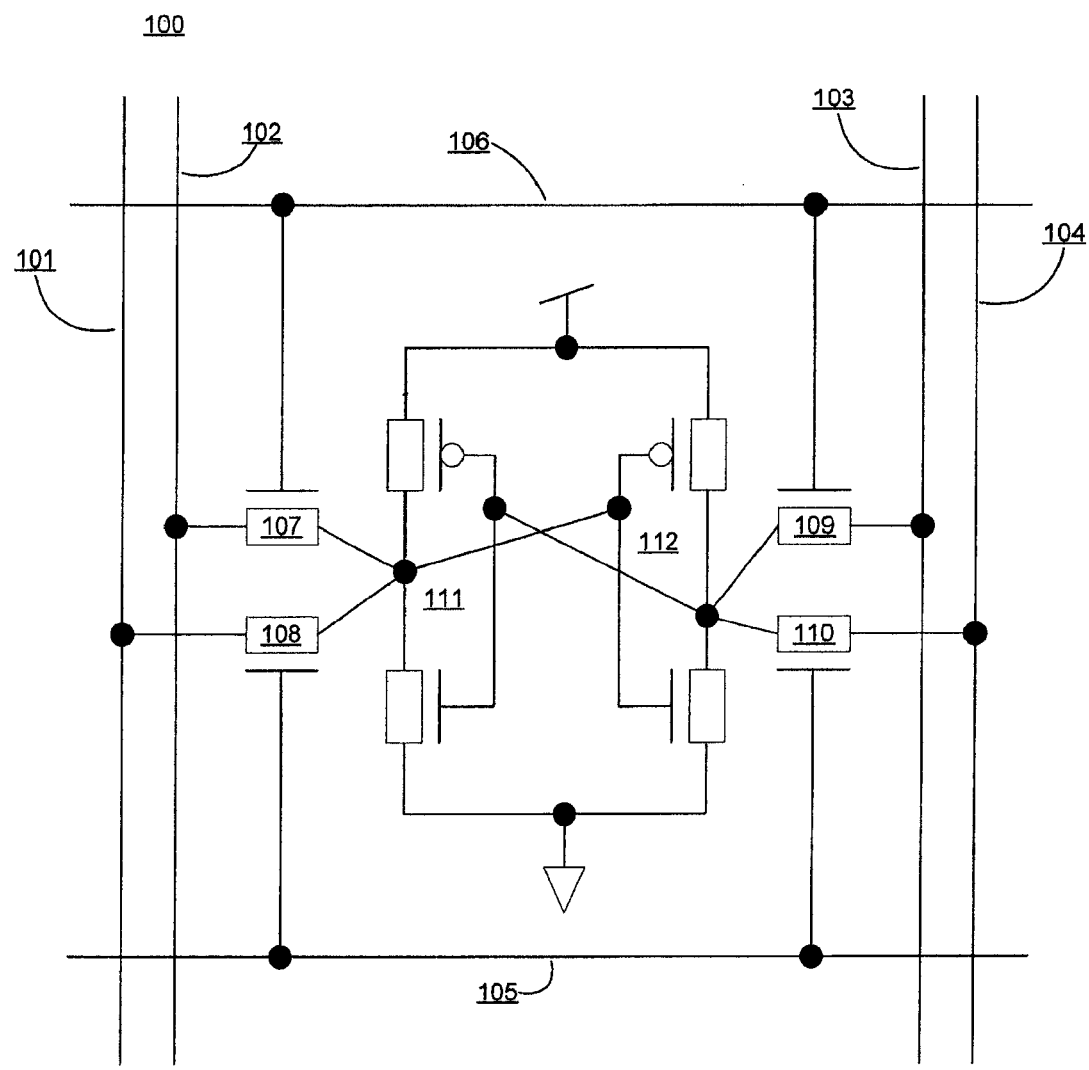
FIG. 1 illustrates an embodiment of a dual beta ratio SRAM cell having a read port and a write port.

FIG. 1 illustrates an embodiment of a dual beta ratio SRAM cell 100 having one read port and one write port. Data is stored in cross-coupled inverters 111 and 112. SRAM cell 100 comprises read bit line pair 101 and 104, and write bit line pair 102 and 103. Cell 100 further comprises read word line 105 and write word line 106. Read bit line 101 is connected to the source (or drain) of passgate 108, read bit line 104 is connected to the source (or drain) of passgate 110, and read word line 105 is connected to the gate terminals of each of passgates 108 and 110. The drains (or sources) of pass-gate 107 and 108 are connected to inverter 111, and the drains (or sources) of passgate 109 and 110 are connected to inverter 112. Passgates 108 and 110 together comprise the read port of cell 100; the beta ratio of the read port is determined by the conductance of passgates 108 and 110. Write bit line 102 is connected to the source (or drain) of passgate 107, write bit line 103 is connected to the source (or drain) of passgate 109, and write word line 106 is connected to the gate terminals of both passgate 107 and pass-gate 109. Passgates 107 and 109 together comprise the write port of cell 100; the beta ratio of the write port is determined by the conductance of passgates 107 and 109.

Figure 2:
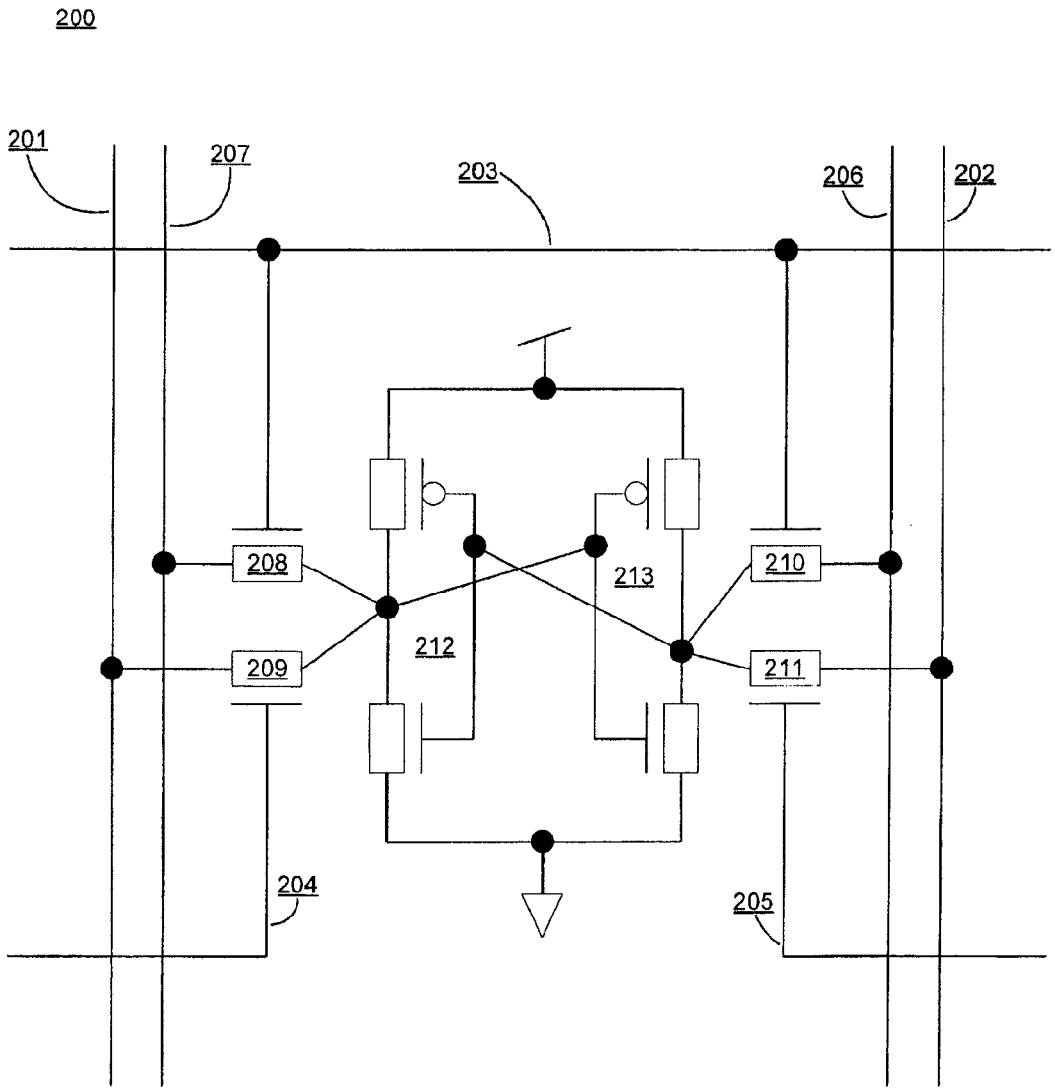
FIG. 2 illustrates an embodiment of a dual beta ratio SRAM cell having two read ports and a write port.

FIG. 2 illustrates an embodiment of a dual beta ratio SRAM cell 200 having two read ports and one write port. Data is stored in cross-coupled inverters 212 and 213. SRAM cell 200 comprises read bit line pair 201 and 202, and write bit line pair 207 and 206. Cell 200 further comprises write word line 203, and two read word lines 204 and 205. Read bit line 201 is connected to the source (or drain) of passgate 209, and read word line 204 is connected to the gate terminal of passgate 209. Read bit line 202 is connected to the source (or drain) of passgate 211, and read word line 205 is connected to the gate terminal of passgate 211. The drains (or sources) of passgates 208 and 209 are connected to inverter 212, and the drains (or sources) of passgates 210 and 211 are connected to inverter 213. Passgate 209 comprises a right read port of cell 200; the beta ratio of the right read port is determined by the conductance of passgate 209. Pass-gate 211 comprises a left read port; the beta ratio of the left read port is determined by the conductance of passgate 211. The left and right read ports may have the same beta ratio. Data read from the left read port has a polarity opposite to the polarity of data read from the right read port, as the right and left read passgates are connected to opposite nodes of cross-coupled invertors 212 and 213. This phase difference between the left and right read ports may be corrected in a read sense amplifier stage, or the phase difference may be used to satisfy different logic functions. Write bit line 207 is connected to the source (or drain) of passgate 208, and write bit line 206 is connected to the source (or drain) of passgate 210. Write word line 203 is connected to the gate terminals of both pass-gates 208 and 210. Passgates 208 and 210 together form the write port of cell 200; the beta ratio of the write port is determined by the conductance of passgates 208 and 210.

Figure 3:
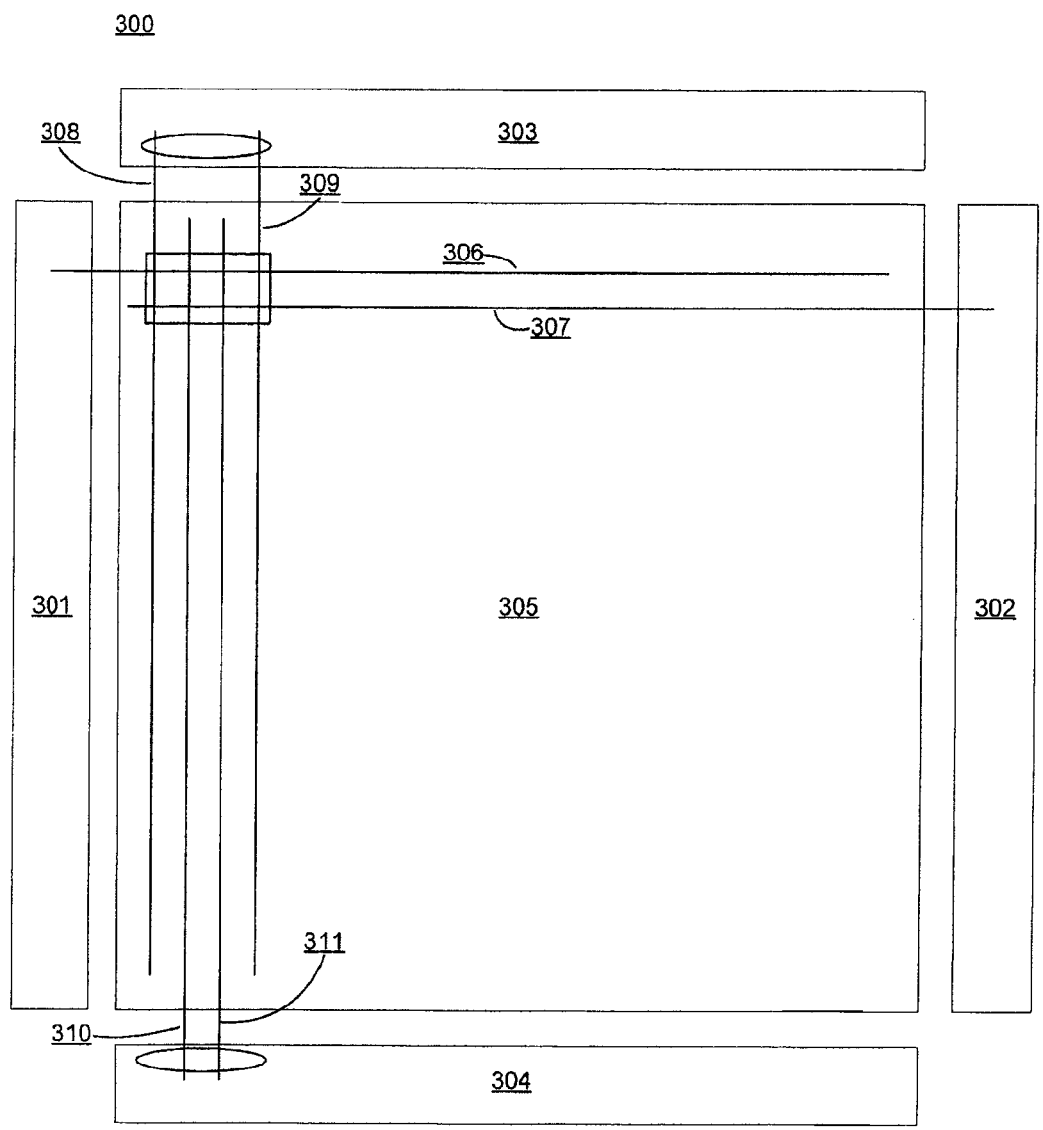
FIG. 3 illustrates an embodiment of an array architecture for a dual beta ratio SRAM cell having a read port and a write port.

FIG. 3 illustrates an embodiment of an array architecture 300 for an SRAM 305 comprising a plurality of 2-port cells, such as is shown in FIG. 1. The array architecture 300 comprises a write decoder and driver block 301, a read decoder and driver block 302, a read sense amplifier block 303, and a write sense amplifier block 304. SRAM 305 comprises a plurality of cells, arranged in rows and columns. The rows and columns are connected by word lines in the row, or word, direction and bit lines in the column, or bit, direction. Write word line 306 and read word line 307 connect cells in a row of SRAM 305. Read bit lines 308 and 309 and write bit lines 310 and 311 connect cells in a column of SRAM 305. Write word line 306, read word line 307, read bit lines 308 and 309, and write bit lines 310 and 311 are shown for exemplary purposes; SRAM 305 may comprise any appropriate number of word and bit lines, as needed to connect all rows and columns of cells in SRAM 305. The array 300 may be simultaneously accessed for one read operation and one write operation.

Figure 4:
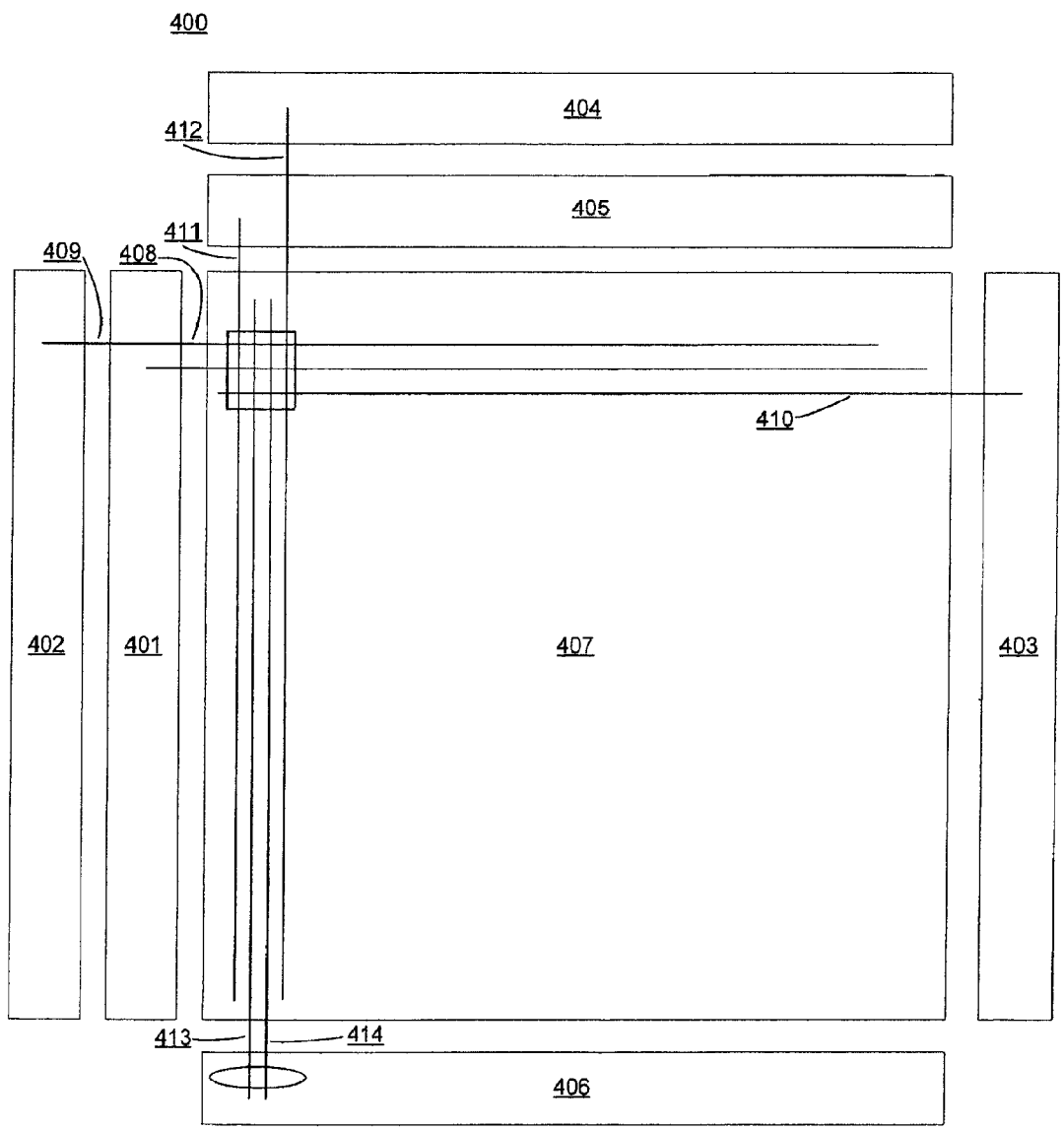
FIG. 4 illustrates an embodiment of an array architecture for a dual beta ratio SRAM cell having two read ports and a write port.

FIG. 4 illustrates an embodiment of an array architecture 400 for an SRAM 407 comprising a plurality of 3-port cells, such as is shown in FIG. 2. The array architecture 400 comprises a write decoder and driver block 401, two read decoder and driver blocks 402 and 403, two read sense amplifier blocks 404 and 405, and a write sense amplifier block 406. SRAM 407 comprises a plurality of cells, arranged in rows and columns. The rows and columns are connected by word lines in the row, or word, direction and bit lines in the column, or bit, direction. Write word line 408 and read word lines 409 and 410 connect cells in a row of SRAM 407. Single-end read bit lines 411 and 412 and write bit-lines 413 and 414 connect cells in a column of SRAM 407. Write word line 408, read word lines 409 and 410, single-end read bit lines 411 and 412, and write bit-lines 413 and 414 are shown for exemplary purposes; SRAM 407 may comprise any appropriate number of word and bit lines, as needed to connect all rows and columns of cells in SRAM 407. The array 400 may be simultaneously accessed for two read operations and one write operation.

In some embodiments, the read port(s) of a dual beta ratio SRAM cell may have a beta ratio in a range between about 2 and about 4, and the write port beta ratio may be in a range between about 0.5 and about 1.5. The read port beta ratio of about 2 to about 4 allows for stability and noise immunity, and the write port beta ratio in the range of about 0.5 to about 1.5 improves write performance.

A SRAM cell having write port beta ratio in the range of about 0.5 to about 1.5 may not be stable if it is half-selected in a write operation, therefore, in a write operation, all the cells along a driven write word line of a dual beta ratio SRAM cell must be written. However, a cell that is half-selected cell in a read operation does not have stability concerns, due to the relatively high read port beta ratio.

The relatively low beta ratio of the write port provides a correspondingly fast write time. As a result, the SRAM's overall write cycle time is reduced, and overall system performance may be improved. A computer system's minimum cycle time may be limited by the SRAM's read or write cycle capability. A fast SRAM write cycle enables a system to increase operating frequency, as a slower SRAM read time may be compensated by having a read latency spanning across a cycle boundary, for example, a 2-cycle read design.

In an exemplary embodiment of a two-port dual beta ratio SRAM cell, the beta ratio for the write port is about 1, and the beta ratio for the read port is about 2.2. The cell size for such an embodiment is about 0.257 microns$^2$ ($\mu m^2$). An exemplary embodiment of a three-port dual beta ratio SRAM cell has a read port beta ratio of about 2.25, and a write port beta ratio of about 1.16. Such an embodiment of a 3-port dual beta ratio SRAM may have a cell size of about 0.367 $\mu m^2$.

The technical effects and benefits of exemplary embodiments include a stable SRAM cell with a relatively fast write cycle time.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A static random access memory (SRAM) array comprising:
   a plurality of SRAM cells, an SRAM cell comprising:
   a first read port, the first read port having a first beta ratio; and
   a write port, the write port having a second beta ratio that is substantially lower than the first beta ratio; and
   a second read port, the second read port having a third beta ratio that is approximately the same as the first beta ratio;
   wherein data read from the first read port has a polarity that is opposite to a polarity of data read from the second read port, and wherein the SRAM array further comprises a first read sense amplifier stage connected to the first read port, and a second read sense amplifier stage connected to the second read port, wherein the second read sense amplifier stage is configured to correct the polarity of data read from the second read port to a polarity that is the same as the data read from the first read port.

2. The SRAM array of claim 1, wherein the SRAM cell comprises eight transistors, and wherein four of the transistors comprise a pair of cross-coupled inverters, two of the transistors comprise the first read port, and two of the transistors comprise the write port.

3. The SRAM array of claim 1, wherein the SRAM cell comprises eight transistors, and wherein four of the transistors comprise a pair of cross-coupled inverters, one of the transistors comprises the first read port, one of the transistors comprises a second read port, and two of the transistors comprise the write port.

4. The SRAM array of claim 1, wherein the first beta ratio is in a range between about 2 and about 4, and wherein the second beta ratio is in a range between about 0.5 and about 1.5.

* * * * *